United States Patent
Ko et al.

(10) Patent No.: US 7,304,877 B2
(45) Date of Patent: Dec. 4, 2007

(54) SEMICONDUCTOR MEMORY DEVICE WITH UNIFORM DATA ACCESS TIME

(75) Inventors: Jae-Bum Ko, Ichon-shi (KR); Sang-Hoon Hong, Ichon-shi (KR); Se-Jun Kim, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 365 days.

(21) Appl. No.: 11/023,659

(22) Filed: Dec. 29, 2004

(65) Prior Publication Data
US 2005/0141255 A1 Jun. 30, 2005

(30) Foreign Application Priority Data
Dec. 29, 2003 (KR) .................. 10-2003-0098565

(51) Int. Cl.
*G11C 5/02* (2006.01)
(52) U.S. Cl. ............... 365/51; 365/63; 365/230.03
(58) Field of Classification Search ............. 365/51, 365/230.03, 63, 230.06, 207, 233, 208, 230.01
See application file for complete search history.

(56) References Cited

U.S. PATENT DOCUMENTS

| 6,625,078 B2 * | 9/2003 | Jones et al. ........... 365/222 |
| 6,625,082 B2 * | 9/2003 | Toda ................ 365/230.03 |
| 6,977,858 B2 * | 12/2005 | Osada et al. .......... 365/222 |

* cited by examiner

*Primary Examiner*—Son Dinh
*Assistant Examiner*—Dang Nguyen
(74) *Attorney, Agent, or Firm*—Lowe Hauptman Ham & Berner LLP

(57) ABSTRACT

A semiconductor memory device includes: a core region having a plurality of bank sets for outputting/storing a data in response to an inputted address, wherein each bank set includes one bank, one row address control unit and two column address control units; and a peripheral region having two pad groups, wherein two pad groups are respectively located at the opposite side of the core region.

6 Claims, 7 Drawing Sheets

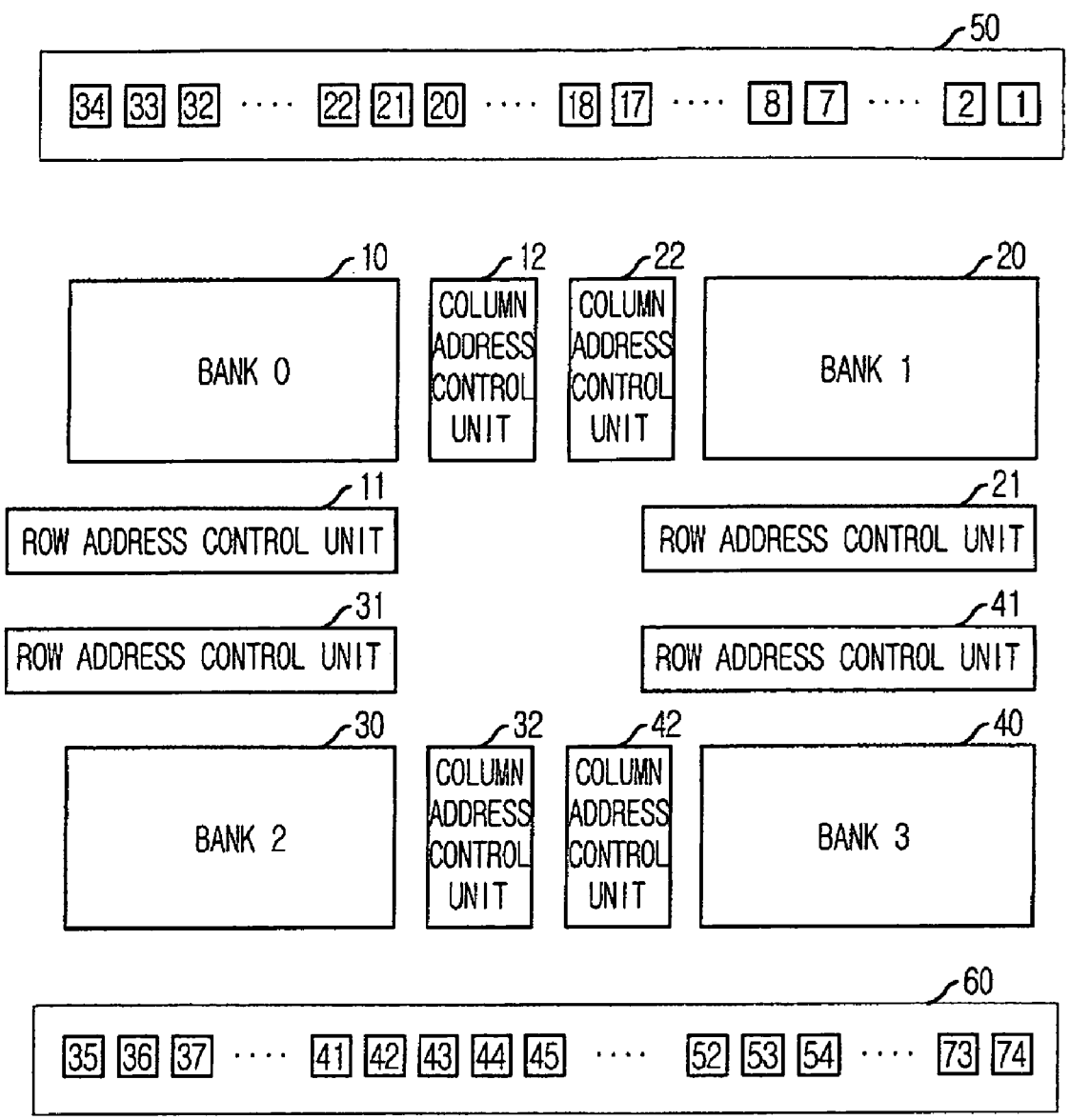

FIG. 2
(PRIOR ART)

| pin | name | pin | name | pin | name | pin | name |
|---|---|---|---|---|---|---|---|
| 1 | A14 | 21 | IO5 | 41 | A2 | 61 | CS2 |
| 2 | /CS1 | 22 | IO13 | 42 | A1 | 62 | /WE |
| 3 | VSS | 23 | IO6 | 43 | A0 | 63 | A13 |
| 4 | OP3 | 24 | VCORE | 44 | A3 | 64 | A12 |
| 5 | VCC | 25 | IO14 | 45 | A4 | 65 | A19 |
| 6 | /OE | 26 | IO7 | 46 | A5 | 66 | A18 |
| 7 | IO1 | 27 | VPERI | 47 | A6 | 67 | A10 |
| 8 | VCCQ | 28 | IO15 | 48 | VCP | 68 | A20 |
| 9 | IO9 | 29 | IO8 | 49 | A7 | 69 | A11 |
| 10 | IO2 | 30 | VSS | 50 | A8 | 70 | A20 |
| 11 | IO10 | 31 | IO16 | 51 | /ADV | 71 | VCC |
| 12 | IO3 | 32 | VPERII | 52 | WBI | 72 | OP2 |
| 13 | VBLP | 33 | A16 | 53 | /LB | 73 | VSS |
| 14 | IO11 | 34 | VSSQ | 54 | /UP | 74 | WAIT |
| 15 | IO4 | 35 | VCC | 55 | MCP | | |
| 16 | VBB | 36 | A17 | 56 | VPP | | |
| 17 | IO12 | 37 | A21 | 57 | CLK | | |
| 18 | VSSQ | 38 | VSS | 58 | VSS | | |
| 19 | VCCQ | 39 | OP0 | 59 | CS2 | | |
| 20 | A15 | 40 | VCC | 60 | /WE | | |

FIG. 6

| pin | name | pin | name | pin | name | pin | name |
|---|---|---|---|---|---|---|---|
| 1 | NC | 21 | IO5 | 41 | A7 | 61 | /WE |
| 2 | OP0 | 22 | IO13 | 42 | A6 | 62 | A20 |
| 3 | VSS | 23 | IO6 | 43 | A5 | 63 | A13 |
| 4 | VCC | 24 | IO14 | 44 | A4 | 64 | A12 |
| 5 | VCP | 25 | IO7 | 45 | A3 | 65 | A11 |
| 6 | WBI | 26 | IO15 | 46 | A0 | 66 | A10 |
| 7 | MCP | 27 | IO8 | 47 | NC | 67 | A9 |
| 8 | VBLPO | 28 | IO16 | 48 | A2 | 68 | A19 |
| 9 | VBB | 29 | VPP | 49 | A1 | 69 | A18 |
| 10 | /WAIT | 30 | VCORE | 50 | /ADV | 70 | A17 |
| 11 | IO1 | 31 | VPERII | 51 | /CS1 | 71 | VCC |
| 12 | IO9 | 32 | OP1 | 52 | /LB | 72 | VSS |
| 13 | IO2 | 33 | VCC | 53 | ?UB | | |
| 14 | IO10 | 34 | VSS | 54 | VCC | | |
| 15 | IO3 | 35 | /OE | 55 | VSS | | |
| 16 | IO11 | 36 | NC | 56 | CLK | | |
| 17 | IO4 | 37 | VSS | 57 | A16 | | |
| 18 | IO12 | 38 | VCC | 58 | A15 | | |
| 19 | VSSQ | 39 | A14 | 59 | CS2 | | |
| 20 | VDDQ | 40 | A8 | 60 | A21 | | |

SEMICONDUCTOR MEMORY DEVICE WITH UNIFORM DATA ACCESS TIME

FIELD OF INVENTION

The present invention relates to a semiconductor memory device; and, more particularly, to a semiconductor memory device capable of reducing difference in data access time by adjusting positioning of data output pads and address input pads in a semiconductor memory device.

DESCRIPTION OF PRIOR ART

FIG. 1 is a block diagram showing a conventional semiconductor memory device.

Referring to FIG. 1, the conventional semiconductor memory device includes a first to a fourth banks 10-40, the banks having the respective row address controlling unit 11-41 and the respective column address controlling unit 12-42. Further, there are included address input pads for receiving external addresses, a number of data input/output pads for input/outputting data, driving voltage input pads for receiving various driving voltages, and a first and a second input pad units 50, 60 for receiving various control signals, in either sides of the banks 10-40.

The number of the input/output pads in the memory device depends on the number of the inputted address signals and the number of data that are input/outputted at a time. In FIG. 1, total 74 input/output pads are included.

FIG. 2 is a table showing input/output pads of a semiconductor memory device shown in FIG. 1.

Referring to the table shown in FIG. 2, the total 74 input/output pads includes 22 address input pads A0-A21, 16 data input/output pads 101-1016, driving voltage input pads VCCQ, VBB, VSS, VCORE and the like for receiving various driving voltages, and control input pads /WE, CS1, CS2, /OE and the like for receiving control signals.

FIG. 3 is a block diagram showing a signal transfer path when data access occurs at a unit cell A in the third bank 30 of a semiconductor memory device shown in FIG. 1.

Referring to FIG. 3, in the memory device, in order to access the data stored at the unit cell A, an address signal that is inputted through the 41-st address input pad is applied to the row address controlling unit 31 corresponding to the third bank 30, and an address signal that is inputted through the 20-th address input pad is applied to the column address controlling unit 32.

In the memory device shown in FIG. 3, all the signal that are inputted through the 22 address input pads are applied to the row address controlling unit 31 and the column address controlling unit 32, which decode them to select one unit cell. The 2 address input pads among the 22 address input pads correspond to the addresses A20, A21 for selecting the bank, the 11 address input pads correspond to the row address signals A9-A19, and the remaining 9 address input pads correspond to the column address signals A0-A8.

In FIG. 3, there is shown an example in that the row address is inputted through the 20-th address input pad and the column address is inputted through the 41-st address input pad.

The row address controlling unit 31 and the column address controlling unit 32 select the unit cell A by decoding the inputted row address and the column address, respectively. Then, the data that is stored at the unit cell A is outputted outside through the 7-th data output pad. Here, data can be outputted outside through any one of the 16 data output pads than the exemplary 7-th data output pad.

FIG. 4 is a block diagram showing a signal transfer path when data access occurs at a unit cell B in the first bank 10 of a semiconductor memory device shown in FIG. 1.

Referring to FIG. 4, in order to access the data that is stored at the unit cell B, an address signal that is inputted through the 41-st address input pad is applied to the row address controlling unit 11 corresponding to the first bank 10, and the address signal that is inputted through the 20-th address input pad is applied to the column address controlling unit 12.

Then, the unit cell B in the first bank is selected and the data stored in the unit cell B is outputted outside through the 7-th data output pad.

As described above, in the memory device typically including 4 banks, the four banks are positioned at the corners, respectively. The row address controlling unit and the column address controlling unit are positioned at one side of the corresponding bank, respectively.

Further, each of the first input/output pad unit 50 and the second input/output pad unit 60 includes data input/output pads and address input pads together.

Accordingly, depending on the selected bank, data access time for which the address signal is decoded to select the unit cell and data is outputted from the selected unit cell can be significantly varied.

Since each of the first input/output pad unit 50 and the second input/output pad unit 60 includes data input/output pads and address input pads together and the distances between the address input pads and the banks are different from each other, path through which the inputted address signal is transferred is varied depending on the selected bank, i.e., decoding time for the address signal is varied depending on the selected bank.

Further, since the distance between the banks and the data input/output pads are significantly different from each other, the time for which data stored at the unit cell in the selected bank is outputted outside through the data output pad is varied with regard to the selected bank.

Due to data access time difference between the banks, high-speed data access is restricted so that the memory device cannot be operated at a high speed.

SUMMARY OF INVENTION

It is, therefore, an object of the present invention to provide a semiconductor memory device capable of having uniform data access time without regard to a data access bank.

In accordance with an aspect of the present invention, there is provided a semiconductor memory device including: a core region having a plurality of bank sets for outputting/storing a data in response to an inputted address, wherein each bank set includes one bank, one row address control unit and two column address control units; and a peripheral region having two pad groups, wherein two pad groups are respectively located at the opposite side of the core region.

BRIEF DESCRIPTION OF THE DRAWINGS

The above and other objects and features of the present invention will become apparent from the following description of preferred embodiments taken in conjunction with the accompanying drawings, in which:

FIG. 1 is a block diagram showing a conventional semiconductor memory device;

FIG. 2 is a table showing input/output pads of a semiconductor memory device shown in FIG. 1;

FIG. 6 is a table showing input/output pads of a semiconductor memory device shown in FIG. 5;

DETAILED DESCRIPTION OF INVENTION

Hereinafter, a semiconductor memory device in accordance with the present invention will be described in detail referring to the accompanying drawings.

Figure 3:
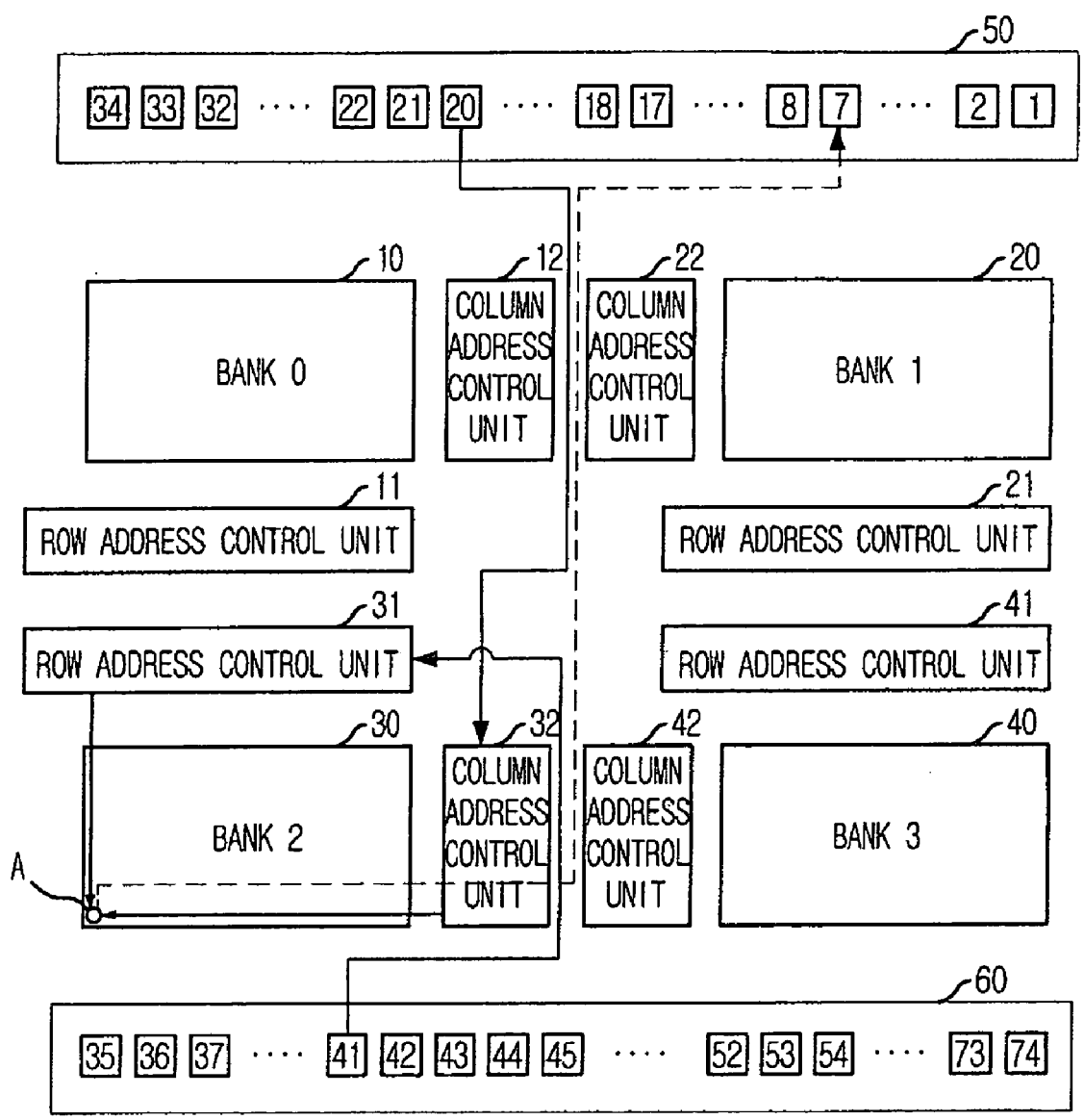
FIG. 3 is a block diagram showing a signal transfer path when data access occurs in the third bank of a semiconductor memory device shown in FIG. 1.
Figure 4:
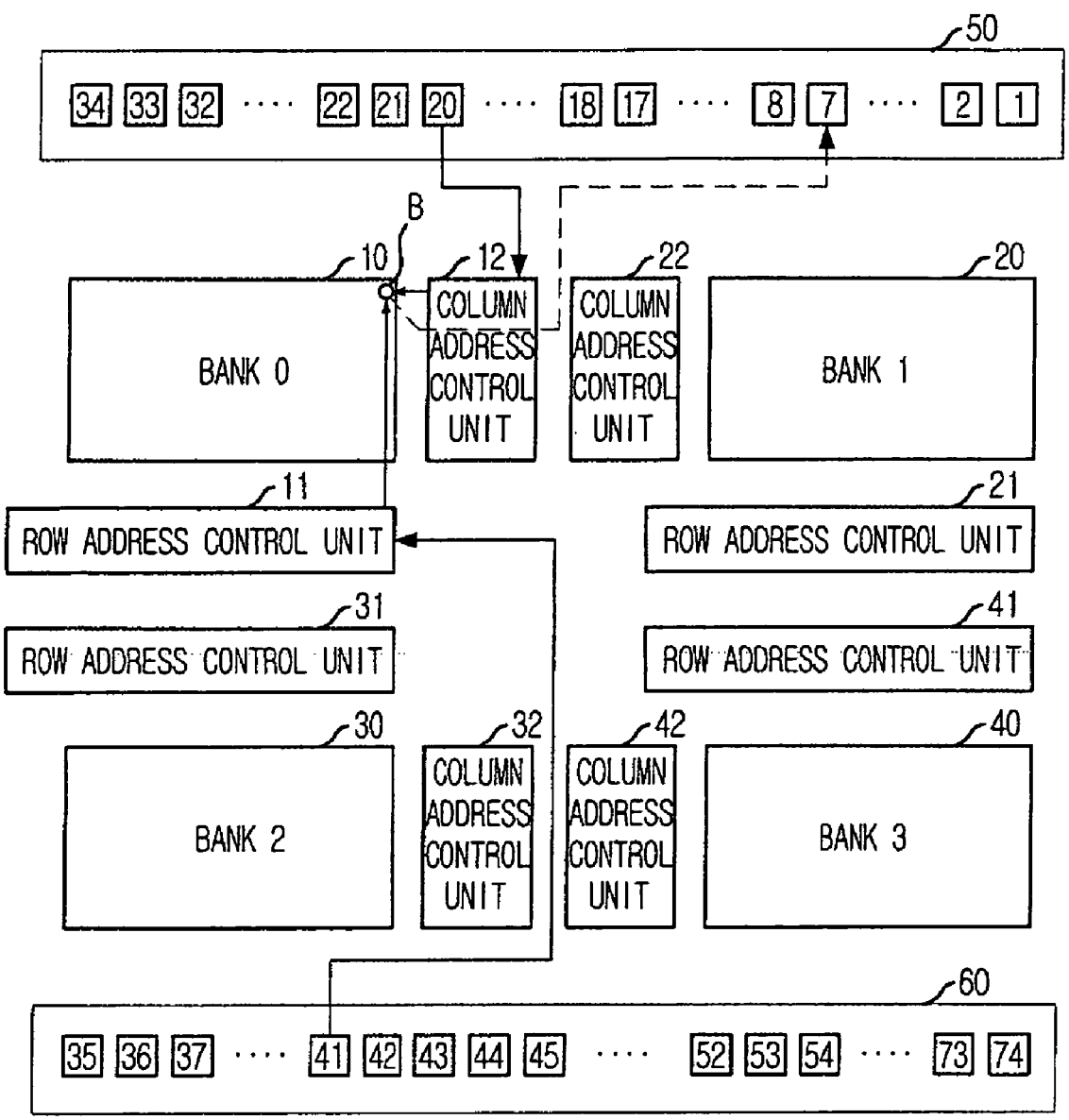
FIG. 4 is a block diagram showing a signal transfer path when data access occurs in the first bank of a semiconductor memory device shown in FIG. 1.
Figure 5:
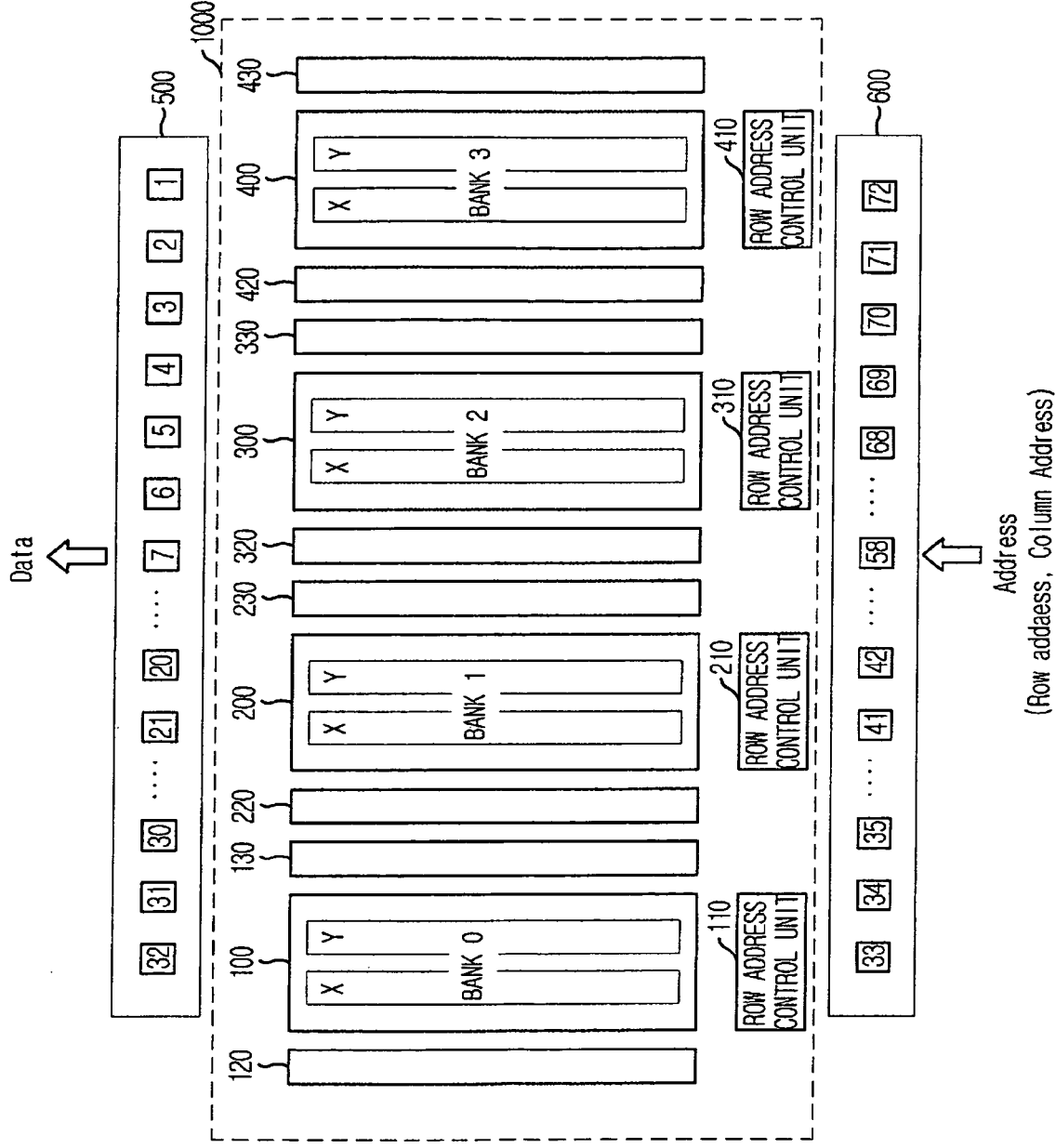
FIG. 5 is a block diagram showing a semiconductor memory device in accordance with a preferred embodiment of the present invention.

FIG. 5 is a block diagram showing a semiconductor memory device in accordance with a preferred embodiment of the present invention.

Referring to FIG. 5, the semiconductor memory device of the present invention includes data input/output pads for inputting/outputting accessed data and address input pads for receiving address signals. The data input/output pads are included in a first input/output pad unit 500 positioned at one side of a memory core region 1000 having a first to a fourth banks 100-400. The plurality of address input pads are included in a second input/output pad unit 600 positioned at the other side of the memory core region 1000.

Here, the first input/output pad unit 500 may further include driving voltage input/output pads for receiving various driving voltages and control signal input/output pads in addition to the data input/output pad. The second input/output pad unit 600 may also further include the driving voltage input/output pads for receiving the various driving voltages and the control signal input/output pads in addition to the address input pads.

However, all the data input/output pads used for data input/output in the memory device of the present invention are positioned in the first input/output pad unit 500 while all the address input pads for address input are positioned in the second input/output pad unit 600.

On the other hand, the memory core region 1000 includes the first to fourth banks 100-400 arranged in a row and each bank has a plurality of unit cells.

The first to fourth banks 100-400 have the respective row address controlling units 110-410, which are arranged at the side in which the second input/output pad unit 600 having the plurality of the address input pads is arranged. Each of the row address controlling units 110-410 processes a row address that is inputted through the address input pads and selects one of a number of word-lines that are included in the corresponding bank.

Further, the memory core region 1000 includes, correspondingly to the bank 100, a first column address controlling unit 120 for processing a column address that is inputted through the plurality of address input pads to access data in the unit cell X that is positioned in the left half region of the unit cells in the bank 100, and a second column address controlling unit 130 for processing the column address that is inputted through the plurality of address input pads to access data in the unit cell Y that is positioned in the right half region of the unit cells in the bank 100. Further, there are included first column address controlling units 220, 320, 420 and second column address controlling units 230, 330, 430 corresponding to the respective remaining banks 200-400.

FIG. 6 is a table showing input/output pads of a semiconductor memory device shown in FIG. 5.

Referring to FIG. 6, there is shown an example for the address input pads and the data input/output pads according to pin numbers of the semiconductor memory device of the present invention. As shown, no address input pad is positioned in the first to 32-nd pads that are included at one side of the memory core region, but all the included are the data input/output pads. On the other hand, no data input/output pad is positioned in the 33-th to 72-th pads that are included at the other side of the memory core region, but all the included are the address input pads.

Figure 7:
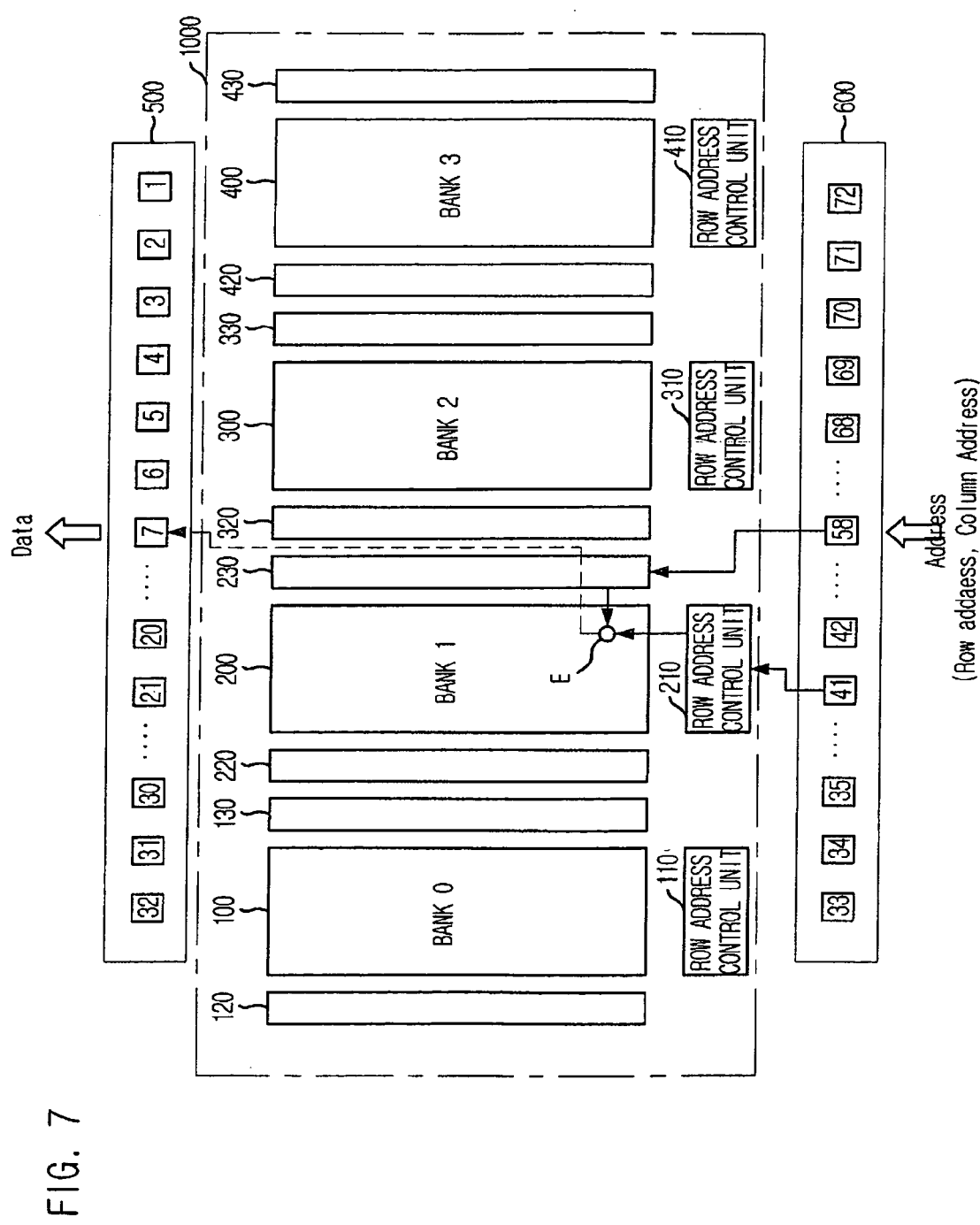
FIG. 7 is a block diagram showing a signal transfer path when data access occurs in the second bank of a semiconductor memory device shown in FIG. 5.

FIG. 7 is a block diagram showing a signal transfer path when data access occurs in the second bank 200 of a semiconductor memory device shown in FIG. 5.

Referring to FIG. 7, a row address that is inputted through the 41-st pad is applied to the row address controlling unit 210 corresponding to the second bank 200 and a column address that is inputted through the 58-th pad is applied to the second column address controlling unit 230 corresponding to the second bank 200 in order to select a unit cell C of the plurality of unit cells. As described above, in the memory device of the embodiment, the left half unit cells among the unit cells that are included in one bank are controlled with the first column address controlling unit, and the right half unit cells are controlled with the second column address controlling unit. Accordingly, since the unit cell C is positioned in the right half region of the first bank 100, it is controlled with the second column address controlling unit 230.

Then, data that is stored in the unit cell C is outputted outside through the 7-th data input/output pad via data transfer path.

Though each of one row address and one column address are shown as inputted to an address input pad, the row address and the column address are actually inputted to all the address input pads in the memory device to be inputted to the row address controlling unit and the column address controlling unit of the corresponding bank, which decodes them to select one unit cell.

Figure 8:
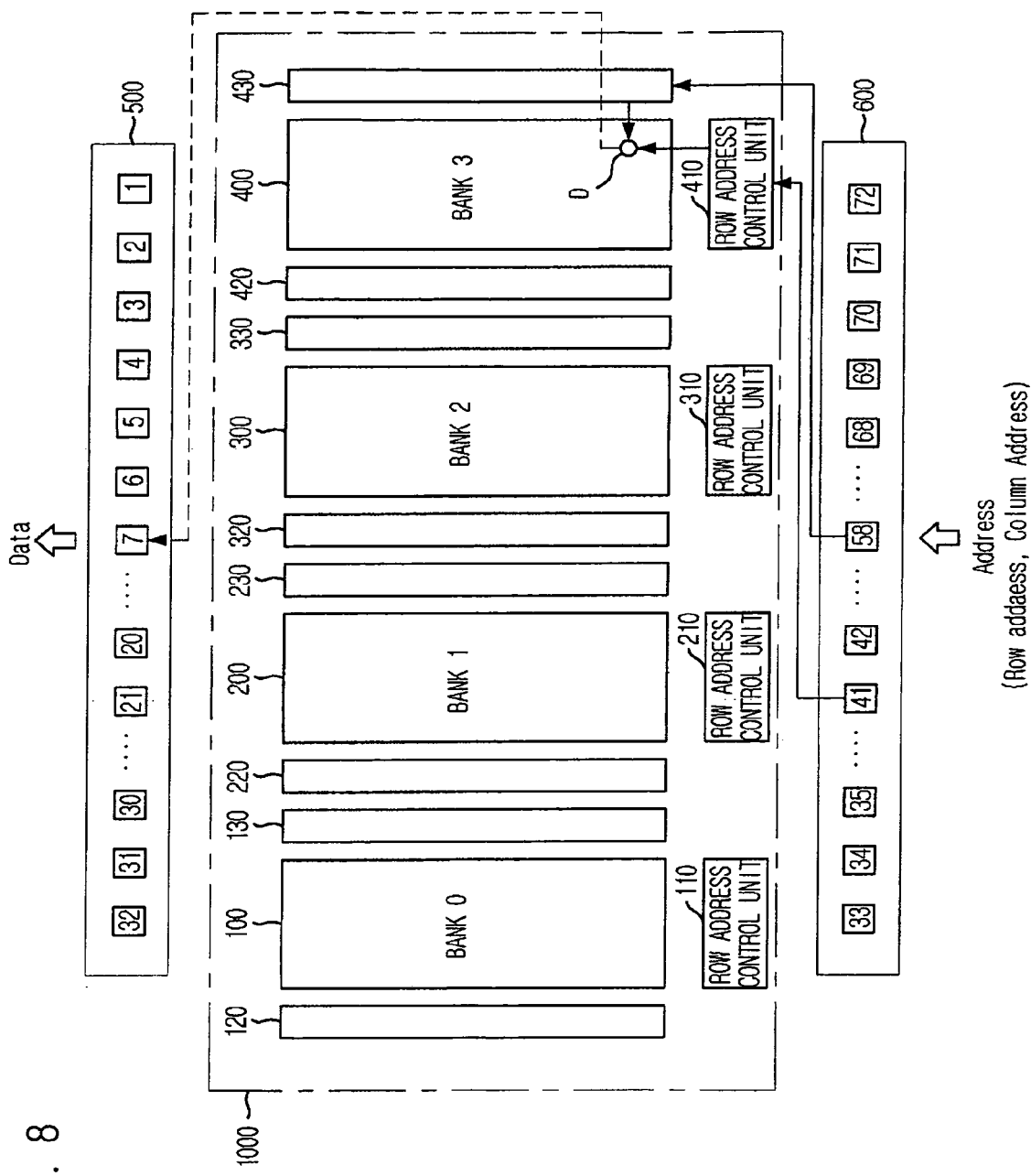
FIG. 8 is a block diagram showing a signal transfer path when data access occurs in the fourth bank of a semiconductor memory device shown in FIG. 5.

FIG. 8 is a block diagram showing a signal transfer path when data access occurs in the fourth bank 400 of the semiconductor memory device shown in FIG. 5.

Referring to FIG. 8, a row address that is inputted through the 41-st pad is applied to the row address controlling unit 410 corresponding to the fourth bank 400 while a column address that is inputted through the 58-th pad is applied to the second column address controlling unit 430 corresponding to the fourth bank 400, thereby the unit cell D positioned in the right half region of the fourth bank 400.

As described above, in the memory device of the embodiment, by positioning all the address input pads in one side(33-th to 72-nd pads) of the memory core region 1000 and positioning all the data input/output pads in the other side(1-st to 32-nd pads) of the memory core region 1000, the paths through which the row address and the column address are transferred to the corresponding row address controlling unit and the corresponding column address controlling unit, respectively, are substantially uniform without regard to the bank that accesses data. Further, the path through which the accessed data is transferred from the bank to the data input/output pad is substantially uniform without regard to the selected bank.

Accordingly, data access time for which the address signal is processed and data is outputted is uniform regardless the selected bank.

Further, in the memory device of the embodiment, by arranging the bank in a line, the distances from all the address input pads to the respective banks are substantially uniform and the distances from the respective banks to all the data input/output pads are substantially uniform. Accordingly, data access time can be maintained uniform regardless of the accessed bank.

Further, in the memory device of the embodiment, the unit cells that are positioned in the left half region of the bank are controlled with the first column address controlling unit that is positioned in the left side of the bank and the unit cells that are positioned in the right half region of the bank are controlled with the second column address controlling unit that is positioned in the right side of the bank so that data access time can be maintained uniform without regard to the position of the unit cell for which data is accessed within the bank.

As described above, with the memory device of the present invention, data access time can be maintained uniform regardless of the data accessed bank.

Further, by constructing the memory device as prescribed, the wiring from the respective address input pads to the respective banks and the wiring from the data input/output pads to the respective banks can be implemented in a simpler form than the conventional wiring, so as to reduce circuit area in layout, i.e., to improve integration of the memory device.

According to the present invention, a memory device having a number of banks can maintain uniform data-access time without regard to data access bank.

The present application contains subject matter related to Korean patent application No. 2003-98565, filed in the Korean Patent Office on Dec. 29, 2003, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device, comprising:
   a memory core region having a plurality of bank sets for outputting/storing a data in response to an inputted address, wherein each bank set includes one bank, one row address control unit and two column address control units;
   a first input/output pad unit disposed at one side of the memory core region; and
   a second input/output pad unit disposed at an opposite side of the memory core region;
   wherein the first input/output pad unit comprises all of data input/output pads and no address input pads; and
   wherein the second input/output pad unit comprises all of address input pads and no data input/output pads.

2. The semiconductor memory device as recited in claim 1, wherein in each bank set, the two column address control units are respectively located at opposite sides of the bank.

3. The semiconductor memory device as recited in claim 2, wherein all bank sets are positioned in one direction in the core region.

4. The semiconductor memory device as recited in claim 3, wherein the core region includes:
   a plurality of row address control units configured to select one of word lines in a corresponding bank according to an inputted address.

5. The semiconductor memory device as recited in claim 4, wherein the plurality of row address control units are positioned between the plurality of bank sets and one of the two pad units.

6. The semiconductor memory device as recited in claim 5, wherein each bank set includes:
   a first column address control unit for decoding a column address in order to access a data of a unit cell included in a left-half region of a bank; and
   a second column address control unit for decoding the column address in order to access a data of a unit cell included in a right-half region of the bank.

* * * * *